United States Patent
Xie et al.

(10) Patent No.: US 11,956,995 B2
(45) Date of Patent: Apr. 9, 2024

(54) OLED DISPLAY PANEL AND OLED DISPLAY DEVICE INCLUDING EDGE CURVED-SURFACE DISPLAY AREA

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jiangrong Xie, Beijing (CN); Chao Kong, Beijing (CN); Kening Zheng, Beijing (CN); Yamin Yang, Beijing (CN); Han Nie, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 335 days.

(21) Appl. No.: 17/044,290

(22) PCT Filed: Mar. 2, 2020

(86) PCT No.: PCT/CN2020/077443
§ 371 (c)(1),
(2) Date: Sep. 30, 2020

(87) PCT Pub. No.: WO2020/192365
PCT Pub. Date: Oct. 1, 2020

(65) Prior Publication Data
US 2021/0057679 A1 Feb. 25, 2021

(30) Foreign Application Priority Data
Mar. 26, 2019 (CN) .......................... 201910233167.5

(51) Int. Cl.
*H10K 50/84* (2023.01)
*H10K 50/844* (2023.01)
(Continued)

(52) U.S. Cl.
CPC ........... *H10K 50/86* (2023.02); *H10K 50/844* (2023.02); *H10K 50/865* (2023.02); *H10K 59/12* (2023.02);
(Continued)

(58) Field of Classification Search
CPC ............. H01L 51/5281; H01L 51/5253; H01L 51/0096; H01L 51/5284; H01L 51/5271;
(Continued)

(56) References Cited

U.S. PATENT DOCUMENTS 9,480,174 B2 * 10/2016 Park ..................... H05K 5/0017
10,185,064 B2 * 1/2019 Powell .................. G06F 1/1637
(Continued)

FOREIGN PATENT DOCUMENTS

CN 206322696 U 7/2017
CN 108598130 A * 9/2018 ......... H01L 27/3232
(Continued)

OTHER PUBLICATIONS

International Search Report dated May 29, 2020 in PCT/CN2020/077443, 14 pages.

*Primary Examiner* — Ida M Soward
(74) *Attorney, Agent, or Firm* — Muncy, Geissler, Olds & Lowe, P.C.

(57) ABSTRACT

The OLED display includes a flat display area and an edge curved-surface display area; wherein the edge curved-surface display area is provided with an optical film layer, and
(Continued)

the optical film layer is configured to reduce a light intensity of emergent light with a preset color in the edge curved-surface display area.

10 Claims, 3 Drawing Sheets

(51) Int. Cl.
| | |
|---|---|
| *H10K 50/86* | (2023.01) |
| *H10K 59/12* | (2023.01) |
| *H10K 59/40* | (2023.01) |
| *H10K 77/10* | (2023.01) |
| *G02F 1/1333* | (2006.01) |
| *G02F 1/1335* | (2006.01) |
| *G06F 1/16* | (2006.01) |
| *G09F 9/30* | (2006.01) |
| *H01L 27/146* | (2006.01) |
| *H10K 50/80* | (2023.01) |
| *H10K 50/842* | (2023.01) |
| *H10K 59/126* | (2023.01) |
| *H10K 102/00* | (2023.01) |

(52) U.S. Cl.
CPC ............ *H10K 59/40* (2023.02); *H10K 77/10* (2023.02); *G02F 1/133305* (2013.01); *G02F 1/133331* (2021.01); *G02F 1/133528* (2013.01); *G06F 1/1641* (2013.01); *G06F 1/1652* (2013.01); *G09F 9/301* (2013.01); *G09G 2380/02* (2013.01); *H01L 27/14678* (2013.01); *H10K 50/8426* (2023.02); *H10K 50/868* (2023.02); *H10K 59/126* (2023.02); *H10K 77/111* (2023.02); *H10K 2102/311* (2023.02); *H10K 2102/351* (2023.02)

(58) Field of Classification Search
CPC ............ H01L 51/5293; H01L 51/5246; H01L 27/323; H01L 27/3244; H01L 51/0097; H01L 27/14678; H01L 2251/5338; G02F 1/133528; G02F 1/13331; G02F 1/133305; G06F 1/1641; G06F 1/1652; H10K 50/86; H10K 50/844; H10K 50/865; H10K 50/8426; H10K 50/868; H10K 50/856; H10K 59/12; H10K 59/40; H10K 77/10; H10K 77/111; H10K 59/126; H10K 2102/311; H10K 2102/351; G09F 9/301; G09G 2380/02
See application file for complete search history.

(56) References Cited

U.S. PATENT DOCUMENTS

| | | | | |
|---|---|---|---|---|
| 10,224,502 B2* | 3/2019 | Cho | ........................ | B05D 7/50 |
| 10,462,896 B1* | 10/2019 | Kwon | ................... | G06F 1/1626 |
| 10,537,037 B2* | 1/2020 | Hsu | ..................... | H04M 1/0283 |
| 10,756,307 B2* | 8/2020 | Park | ........................ | G06F 3/044 |
| 10,879,213 B2* | 12/2020 | Kim | ......................... | B32B 3/08 |
| 11,309,370 B1* | 4/2022 | Brown | ................. | H10K 50/868 |
| 2013/0002583 A1* | 1/2013 | Jin | ........................... | G06F 3/041 |
| | | | | 313/511 |
| 2014/0002385 A1* | 1/2014 | Ka | ......................... | H05B 33/04 |
| | | | | 345/173 |
| 2014/0132488 A1* | 5/2014 | Kim | ...................... | G06F 1/1637 |
| | | | | 345/76 |
| 2014/0299884 A1* | 10/2014 | Park | .................... | H10K 77/111 |
| | | | | 438/23 |
| 2015/0003022 A1* | 1/2015 | Chang | ............... | G02F 1/133308 |
| | | | | 361/679.01 |
| 2015/0017393 A1* | 1/2015 | Oh | ........................... | B32B 3/06 |
| | | | | 428/177 |
| 2015/0043180 A1* | 2/2015 | Lee | ....................... | G06F 1/1626 |
| | | | | 361/752 |
| 2015/0108439 A1* | 4/2015 | Kim | ....................... | H10K 59/40 |
| | | | | 257/40 |
| 2015/0138041 A1* | 5/2015 | Hirakata | ............. | H10K 77/111 |
| | | | | 345/1.3 |
| 2015/0173212 A1* | 6/2015 | Lee | ........................ | H05B 47/10 |
| | | | | 361/752 |
| 2015/0234431 A1* | 8/2015 | Jung | ........................ | G09G 5/00 |
| | | | | 349/12 |
| 2016/0034078 A1* | 2/2016 | Ryu | ..................... | G06F 3/04164 |
| | | | | 345/174 |
| 2016/0062391 A1* | 3/2016 | Choi | ..................... | G06F 1/1652 |
| | | | | 361/679.01 |
| 2016/0101610 A1* | 4/2016 | Namkung | ............. | B29C 61/065 |
| | | | | 156/196 |
| 2016/0113135 A1* | 4/2016 | Kim | ...................... | H04M 1/185 |
| | | | | 361/679.01 |
| 2016/0293895 A1* | 10/2016 | Kim | ................... | H10K 50/8428 |
| 2016/0307973 A1* | 10/2016 | Yang | ..................... | H10K 50/84 |
| 2016/0365402 A1* | 12/2016 | Lee | ..................... | H04M 1/0266 |
| 2017/0012235 A1* | 1/2017 | Kwon | ................... | H01L 51/5246 |
| 2017/0077439 A1* | 3/2017 | Lee | ..................... | H01L 51/0097 |
| 2017/0092703 A1* | 3/2017 | Bae | ..................... | G02F 1/1368 |
| 2017/0171989 A1* | 6/2017 | Kim | ...................... | H01L 27/323 |
| 2017/0192140 A1* | 7/2017 | Yoon | ..................... | G09G 3/03 |
| 2017/0236877 A1* | 8/2017 | Jeong | ................... | H01L 51/5253 |
| | | | | 257/40 |
| 2017/0263492 A1* | 9/2017 | Son | .................... | H01L 21/67092 |
| 2017/0293194 A1* | 10/2017 | Hou | ..................... | H01L 51/0097 |
| 2017/0317309 A1* | 11/2017 | Yang | ..................... | H05K 5/0017 |
| 2017/0324060 A1* | 11/2017 | Kim | ...................... | H10K 50/844 |
| 2018/0033986 A1 | 2/2018 | Takai et al. | | |
| 2018/0074358 A1* | 3/2018 | Jeon | ..................... | G02F 1/13458 |
| 2018/0088631 A1* | 3/2018 | Park | ..................... | H04M 1/0266 |
| 2018/0113241 A1* | 4/2018 | Powell | ..................... | G02B 5/32 |
| 2018/0188874 A1* | 7/2018 | Cho | ........................ | H03K 17/96 |
| 2018/0259805 A1* | 9/2018 | Takehara | ............ | G02F 1/136209 |
| 2019/0073001 A1* | 3/2019 | Kim | ...................... | G04B 39/008 |
| 2019/0239374 A1* | 8/2019 | Cha | ....................... | H04M 1/0202 |
| 2019/0273217 A1* | 9/2019 | Lee | ........................ | G06F 3/0414 |
| 2019/0343010 A1* | 11/2019 | Ji | ........................... | G06F 1/1637 |
| 2021/0057679 A1 | 2/2021 | Xie et al. | | |
| 2021/0325932 A1* | 10/2021 | Bushnell | ................ | G04G 17/08 |

FOREIGN PATENT DOCUMENTS

| | | |
|---|---|---|
| CN | 108828826 A | 11/2018 |
| CN | 109920938 A | 6/2019 |

* cited by examiner

OLED DISPLAY PANEL AND OLED DISPLAY DEVICE INCLUDING EDGE CURVED-SURFACE DISPLAY AREA

CROSS-REFERENCE TO RELATED APPLICATIONS

The present application is the U.S. national phase of PCT Application PCT/CN2020/077443 filed on Mar. 2, 2020, which claims a priority to Chinese Patent Application No. 201910233167.5 filed in China on Mar. 26, 2019, the disclosures of which are incorporated herein in their entirety by reference.

TECHNICAL FIELD

The present disclosure relates to the field of display technology, and in particular to an OLED display panel and an OLED display device.

BACKGROUND

OLED refers to Organic Light-Emitting Diode, and is also called Organic Electro-luminescence Display (GELD). The basic structure thereof is a thin and transparent indium tin oxide with semiconductor characteristics, connected to a power anode and another metal cathode, and wrapped into a sandwich structure. When power is supplied to an appropriate voltage, generally within 10V, electron holes injected by an anode and charges injected by a cathode will be combined in a light-emitting layer to produce light. With the continuous development of technology, curved display screens are becoming more and more popular, and for a curved OLED display screen, at a certain viewing angle, there may be a chromatic aberration between an arc-shaped edge area and a flat area of the curved display screen.

SUMMARY

Some embodiments of the present disclosure provide an OLED display panel, including: a flat display area and an edge curved-surface display area; where the edge curved-surface display area is provided with an optical film layer, and the optical film layer is configured to reduce a light intensity of emergent light with a preset color in the edge curved-surface display area.

In some embodiments of the present disclosure, the OLED display panel includes a light-emitting unit and an encapsulation layer, where the encapsulation layer is disposed on a side of the light-emitting unit close to a light-emitting surface of the OLED display panel, and the optical film layer is disposed on a side of the encapsulation layer away from the light-emitting unit.

In some embodiments of the present disclosure, the light-emitting unit includes an anode, an light-emitting layer and a cathode; where the anode, the light-emitting layer, the cathode and the encapsulation layer are set in sequence, and the optical film layer is disposed on a side of the encapsulation layer away from the cathode.

In some embodiments of the present disclosure, the optical film layer is at least one of a reflection enhancing film and a light absorbing film.

In some embodiments of the present disclosure, the optical film layer includes a reflection enhancing film; subsequent to an entrance of an incident light into the reflection enhancing film, a propagation distance d of the incident light in the enhancing film satisfies a following formula: $2nd = (2k+1)\lambda/2$ to increase a reflectivity of light with a wavelength of k, where $k=0, 1, 2 \ldots$, n is a refractive index of the reflection enhancing film.

In some embodiments of the present disclosure, subsequent to the entrance of the incident light into the reflection enhancing film, a propagation distance d of the incident light in the enhancing film satisfies a following formula:

$$d = \lambda/4n.$$

In some embodiments of the present disclosure, the optical film layer includes a reflection enhancing film, and a thickness of the reflection enhancing film decreases with an increase of an incident angle of light incident to the reflection enhancing film.

In some embodiments of the present disclosure, the optical film layer includes a light absorbing film; a transmittance of light that passes through the light absorbing film becomes lower as an incident angle of light incident to the light absorbing film becomes larger.

In some embodiments of the present disclosure, the optical film layer is provided with a first surface and a second surface opposite to each other; the first surface is located on a side of the optical film layer close to the encapsulation layer, and at least one of the first surface and the second surface is a concave-convex surface.

In some embodiments of the present disclosure, a cross section of the first surface is a W shape, and a cross section of the second surface is a W shape.

In some embodiments of the present disclosure, the preset color includes at least one color.

An OLED display device is further provided according to some embodiments of the present disclosure, including the above OLED display panel.

In some embodiments of the present disclosure, the OLED display device further includes a touch panel located on the optical film layer.

BRIEF DESCRIPTION OF THE DRAWINGS

To better clarify technical solutions of embodiments of the present disclosure, drawings used in description of the embodiments are briefly introduced hereinafter. Apparently, the described drawings merely illustrate a part of the disclosed embodiments. A person of ordinary skill in the art can obtain other drawings based on the described drawings without any creative efforts.

DETAILED DESCRIPTION

Figure 1:
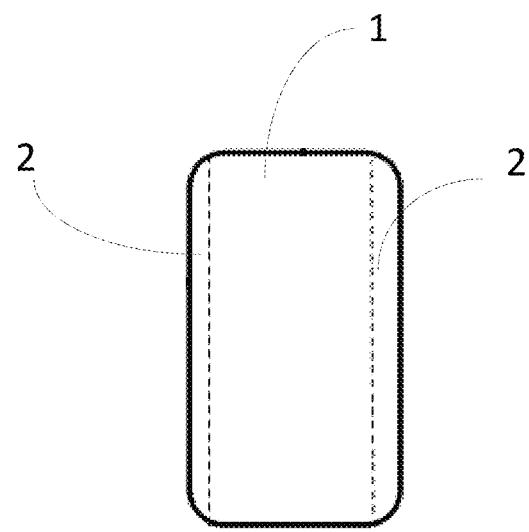
FIG. 1 shows a schematic structural diagram of an OLED display panel in some embodiments of the present disclosure.
Figure 2:
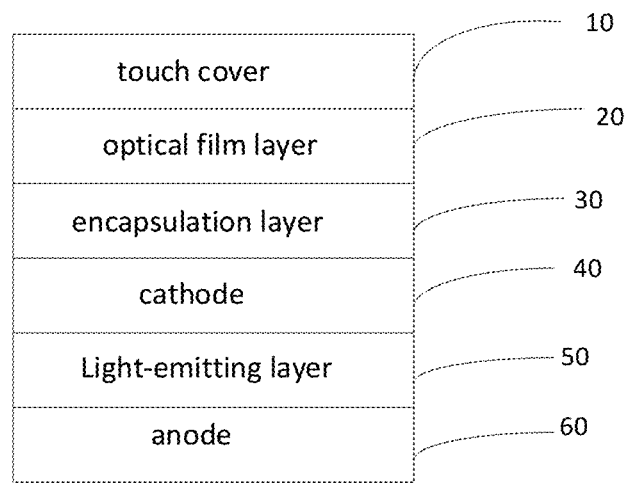
FIG. 2 show a block diagram of an OLED display device in some embodiments of the present disclosure.

To describe the objectives, the technical solutions and the characteristics of embodiments of the present disclosure more clearly, the technical solutions of embodiments of the present disclosure are described clearly and completely in conjunction with drawings of the embodiments of the present disclosure. Apparently, the described embodiments are merely a part of rather than all embodiments of the present disclosure. All other embodiments obtained by a person of ordinary skill in the art based on the described embodiments of the present disclosure, shall fall within the scope of the present disclosure.

In view of the problem of chromatic aberration between an arc-shaped edge area and a flat area of a curved OLED display screen, the present disclosure provides an OLED display panel, which reduces the intensity of at least one color of light emitted from an edge curved-surface display area through a setting of an optical film layer. Furthermore, a color ratio is adjusted, and the chromatic aberration between the flat display area and the edge curved-surface display area is reduced.

As shown in FIG. 1 to FIG. 5, some embodiments of the present disclosure provide an OLED display panel 100, including a flat display area 1 and an edge curved-surface display area 2; where the edge curved-surface display area 2 is provided with an optical film layer 20, and the optical film layer 20 is configured to reduce a light intensity of emergent light with a preset color in the edge curved-surface display area. The preset color includes at least one color.

Through the setting of the optical film layer 20, the intensity of at least one color of light emitted from the edge curved-surface display area 2 is reduced. Furthermore, the color ratio is adjusted, and the chromatic aberration between the flat display area 1 and the edge curved-surface display area 2 is reduced.

In some embodiments of the present disclosure, the OLED display panel 100 includes a light-emitting unit and an encapsulation layer. The encapsulation layer is disposed on a side of the light-emitting unit close to a light-emitting surface of the OLED display panel. The optical film layer 20 is disposed on a side of the encapsulation layer 30 away from the light-emitting unit.

In some embodiments of the present disclosure, the light-emitting unit may include an anode 60, a light-emitting layer 50 and a cathode 40, and the optical film layer 20 may be disposed on a side of the encapsulation layer 30 away from the cathode 40. In some embodiments of the present disclosure, the anode 60, the light-emitting layer 50, the cathode 40 and the encapsulation layer 30 are set in sequence, and the optical film layer 20 is disposed on a side of the encapsulation layer 30 away from the cathode 40.

In some embodiments of the present disclosure, the light-emitting layer 50 may be an RGB light-emitting layer, that is, the light-emitting layer 50 includes a red light-emitting layer, a green light-emitting layer, and a blue light-emitting layer, so that color display can be realized without setting a color film.

In some embodiments of the present disclosure, the optical film layer 20 is a reflection enhancing film 21 or a light absorbing film 22. A structure of the optical film layer 20 is specifically described below by taking a reflection enhancing film or a light absorbing film as an example.

In some embodiments of the present disclosure, the optical film layer 20 is a reflection enhancing film 21.

Since light is reflected multiple times in the reflection enhancing film, there are a series of parallel beams on the two opposite surfaces of the reflection enhancing film (light-emitting surface and light-incident surface). Through constructive interference, light extraction can be reduced. Setting a reflection enhancing film for light with a preset color can reduce the intensity of at least one preset color of light; and/or the absorption rate of at least one color of light is increased by the light absorbing film, thereby reducing the intensity of at least one color of light.

Figure 6:
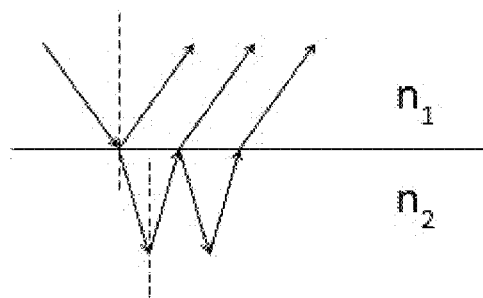
FIG. 6 shows a schematic diagram of an optical path for improving reflectivity through a reflection enhancing film in some embodiments of the present disclosure.

FIG. 6 is a schematic diagram of an optical path of a light that is incident from a medium with a refractive index of $n_1$ to a single-layer reflection enhancing film with a refractive index of $n_2$. The reflectivity can be increased by more than 30% through the selection of refractive index. When the light is incident from a medium with a refractive index of $n_1$ to the single-layer enhancing with refractive index $n_2$, it will be reflected multiple times in the reflection enhancing film, and two opposite surfaces of the reflection enhancing film (light emitting surface and light incident surface) respectively have a series of parallel beams. A reflectivity of the reflection enhancing film for a light with a preset wavelength will satisfy a Fresnel formula.

In embodiments of the present disclosure, a reflection enhancing film is provided to reduce a corresponding light extraction through constructive interference. In order to achieve constructive interference, the reflection enhancing film needs to satisfy $2nd=k\lambda$. In addition, the reflection enhancing film has a half-wave loss, $\lambda/2$ needs to be added, so in order to make a light with a wavelength $\lambda$ incident on the reflection enhancing film increase a reflectivity and reduce an intensity of a light with a wavelength $\lambda$, subsequent to an entrance of an incident light into the reflection enhancing film, a propagation distance d in the enhancing film needs to satisfy a following formula:

i. $2nd=(2k+1)\lambda/2$ to increase a reflectivity of light with a wavelength of $\lambda$, where k=0, 1, 2 . . . , n is a refractive index of the reflection enhancing film.

Since the reflection enhancing film should not be too thick, in some embodiments of the present disclosure, k=0, subsequent to an entrance of an incident light into the reflection enhancing film, a propagation distance d in the enhancing film needs to satisfy a following formula: $d=\lambda/4n$.

According to the above formula, when the refractive index n of the reflection enhancing film is determined, the propagation distance d is in a one-to-one correspondence with the wavelength $\lambda$, of the incident light, that is, for the red or green light that needs to be increased, if the wavelength $\lambda$, of the incident light is determined, the propagation distance d is determined correspondingly.

In some embodiments of the present disclosure, a thickness of the reflection enhancing film decreases with an increase of an incident angle of light incident to the reflection enhancing film.

The reflection enhancing film is provided in the edge curved-surface display area 2, and incident angles of lights incident on the reflection enhancing film are different. In order to reduce the difference in the reflection enhancing effect of the reflection enhancing film at different positions of the edge curved-surface display area, the reflection enhancing film provided on the edge curved-surface display area 2 is not uniformly thick. In some embodiments of the present disclosure, the thickness of the reflection enhancing film decreases with an increase of an incident angle of light incident to the reflection enhancing film, so that the reflection enhancing effect of the reflection enhancing film at different positions on the edge curved-surface display area tends to be consistent.

Figure 7:
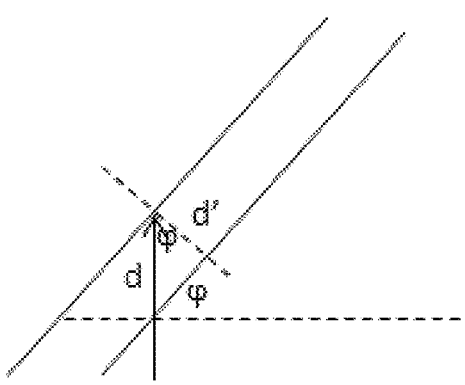
FIG. 7 shows a schematic diagram of an optical path incident on a reflection enhancing film at a preset angle in some embodiments of the present disclosure.

FIG. 7 is a schematic diagram of a light incident on the reflection enhancing film obliquely entering the reflection enhancing film at a certain angle φ. The greater an inclination angle (the incident angle of incident light φ) of the reflection enhancing film, the thinner the reflection enhancing film. d is a path that light travels in a medium with a refractive index of n, d is an actual film thickness of the reflection enhancement film, and d'=d*cos φ. For a certain light with a certain wavelength λ, to realize a propagation path d=λ/4n of the reflection enhancing film is a fixed value, then d'=λ cos φ/4n. The larger the φ, the smaller the actual thickness d' of reflection enhancing film, that is, the greater the inclination angle of the reflection enhancing film, the thinner the coating. In other words, when a path length of the incident light propagating from the light-incident surface of the reflection enhancing film to the light-emitting surface of the reflection enhancing film is constant, the incident light enters the reflection enhancing film obliquely at a certain angle φ, and a theoretical thickness of the reflection enhancing film will decrease with increase of an incident tilt angle. The specific data is shown in the table below.

| | $d' = \lambda\cos\varphi/4n$ | | | | | | | |
|---|---|---|---|---|---|---|---|---|
| | MgF$_2$, refractive index is 1.38 | | | | CaF$_2$, refractive index is 1.43 | | | |
| angel | red light (625 nm) | Green Light (530 nm) | Blue light (460 nm) | Re. | red light (625 nm) | Green Light (530 nm) | Blue light (460 nm) | Re. |
| 0° | 113.2 | 96.0 | 83.3 | Simulate | 109.3 | 92.7 | 80.4 | Simulate |
| 10° | 111.5 | 94.6 | 82.1 | different | 107.6 | 91.2 | 79.2 | different |
| 20° | 106.4 | 90.2 | 78.3 | conditions | 102.7 | 87.1 | 75.6 | conditions |
| 30° | 98.1 | 83.2 | 72.2 | with the | 94.6 | 80.2 | 69.6 | with the |
| 40° | 86.7 | 73.6 | 63.8 | same | 83.7 | 71.0 | 61.6 | same |
| 50° | 72.8 | 61.7 | 53.6 | reflectivity | 70.2 | 59.6 | 51.7 | reflectivity |
| 60° | 56.6 | 48.0 | 41.7 | | 54.6 | 46.3 | 40.2 | |
| 70° | 38.7 | 32.8 | 28.5 | | 37.4 | 31.7 | 27.5 | |

The above table shows a specific wavelength of light (red light, green light and blue light are shown in the table) obliquely incident on the reflection enhancing film at different angles φ. Under the premise of ensuring the reflection enhancing effect, the corresponding thickness of the reflection enhancing film. When the incident angle φ increases, the thickness of the reflection enhancing film decreases (in nanometers, nm), and the theoretical reflectivity is the same (unchanged). For example, when the reflection enhancing film is made of MgF2 with a refractive index of 1.38, the incident angle φ is 0 degree. In order to ensure the reflection enhancing effect on red light, a thickness of the reflection enhancing film is 113.2 nm. When the reflection enhancing film is made of MgF2 with a refractive index of 1.38, the incident angle φ is 10 degrees. In order to ensure the reflection enhancing effect on red light, a thickness of the reflection enhancing film is 111.5 nm.

In some embodiments of the present disclosure, the incident angle φ may be, for example, 30 degrees to 50 degrees, which can ensure process implementation and appropriately reduce the film thickness.

In embodiments of the present disclosure, the thickness of the reflection enhancing film can also be reduced by selecting materials with different refractive indexes n. As shown in the above table, when the incident angle φ is constant, the thickness of the reflection enhancing film made of MgF2 is greater than that of the reflection enhancing film made of CaF2.

Setting up a reflection enhancing film can increase the reflectivity of the light with the preset color and reduce the emission of the light with the preset color by constructive interference. The degree of reflection enhancement is related to the properties of the material, such as the surface flatness of the material itself, and the arrangement of atoms. Therefore, materials with different reflectivities can be selected to adjust the extent of reflection enhancement. There can be many choices of materials for the reflection enhancing film. In embodiments of the present disclosure, the material of the reflection enhancing film is made of MgF2 (magnesium fluoride). Etc. It is also possible to adjust the reflectivity of the reflection enhancing film by doping metal particles in MgF2, but it is not limited to this.

Figure 3:
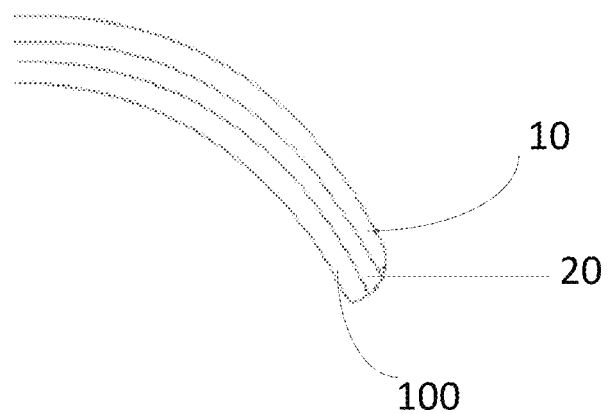
FIG. 3 shows a schematic diagram 1 of a partial structure of an OLED display device in some embodiments of the present disclosure.

In some embodiments of the present disclosure, the optical film layer 20 is provided with a first surface and a second surface opposite to each other; the first surface is located on a side of the optical film layer close to the encapsulation layer 30, the first surface and the second surface may be flat surfaces, as shown in FIG. 3, or, at least one of the first surface and the second surface is a concave-convex surface.

In some embodiments of the present disclosure, the first surface and the second surface are both concave-convex surface. By setting concave-convex surfaces of the reflection enhancing film, the optical path of the light incident on the reflection enhancing film in the reflection enhancing film is increased, and the thickness of the reflection enhancing film can be reduced. The film thickness of the reflection enhancing film can be optimized and thinned, which is adjustable.

Figure 4:
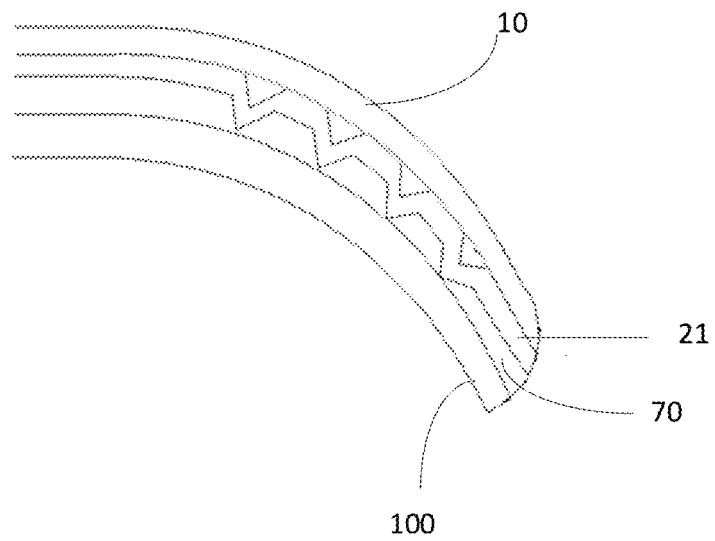
FIG. 4 shows a schematic diagram 2 of a partial structure of an OLED display device in some embodiments of the present disclosure.
Figure 5:
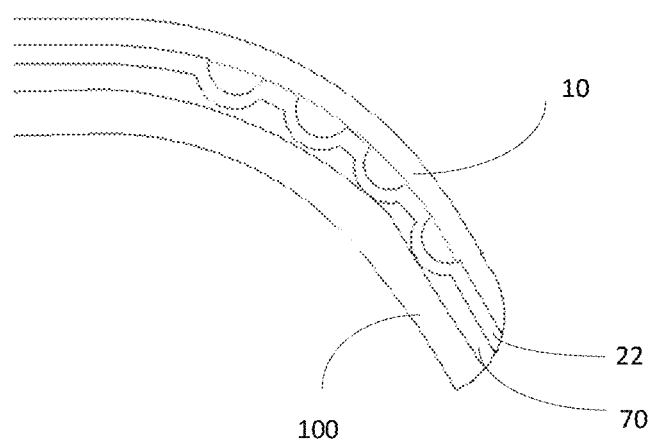
FIG. 5 shows a schematic diagram 3 of a partial structure of an OLED display device in some embodiments of the present disclosure.

The specific structure of a concave-convex surface can be in various forms, as shown in FIG. 4, a cross section of the first surface is a W shape, and a cross section of the second surface is a W shape. The specific structural forms of the first surface and the second surface may also be other structural forms, which will not be listed here.

In embodiments of the present disclosure, each convex portion on the first surface or the second surface corresponds to a pixel unit, and an area of an orthographic projection of each convex portion on the edge curved-surface display area is larger than an area of a pixel (one or more of RGB pixels) that needs to be increased or reversed.

In embodiments of the present disclosure, the surface of the reflection enhancing film close to the encapsulation layer 30 has a concave-convex structure, and the encapsulation layer 30 and the reflection enhancing film may be connected by an adhesive layer to increase the stability of the connection between the encapsulation layer 30 and the reflection enhancing film.

The reflection enhancing film is configured to increase the reflection of one or more of the three types of RGB light, achieving the function of re-adjusting the ratio of the RGB emergent light, which is beneficial to improve the uniformity of the curved screen. If the concave-convex structure is not used, directly plating a flat reflection enhancing film, the film layer calculated is thicker, which is not conducive to processing. However, the current concave-convex shaped reflection enhancing film can reduce the thickness of the reflection enhancing film and facilitate processing.

In embodiments of the present disclosure, the manufacturing process of the reflection enhancing film is as follows:

A SiNx layer is plated on the encapsulation layer corresponding to the edge curved-surface display area 2 by chemical vapor deposition;

A concave-convex structure is formed on the SiNx layer 70 through exposure and development;

Then, a reflection enhancing film is formed on the SiNx layer 70 through a sputtering process (so that the reflection enhancing film is concave-convex), specifically:

Discharge of inert gas is used to generate charged particles. The charged particles hit a surface of a target material (such as metal-doped MgF2) after being accelerated by an electric field, so that target atoms are bombarded and fly out, and secondary electrons are generated at the same time. After being bombarded, the target atoms carry enough kinetic energy to reach a surface to be plated (SiNx surface) for deposition.

Use liquid glue to fill up a side of the reflection enhancing film away from the encapsulation layer to facilitate assembly with the touch cover.

A touch sensor (sensor), a polarizer (pol) and a cover (Cover) are formed in sequence.

Whether a concave-convex surface of the reflection enhancing film is filled or not can be set according to actual needs. In other embodiments, the concave-convex surface of the reflection enhancing film may not be filled, that is, after assembly with the cover, there is a gap between a concave portion of the reflection enhancing film and the cover.

It should be noted that, in some embodiments of the present disclosure, the reflection enhancing film can be a single layer or multiple layers. When the reflection enhancing film is a multi-layer, multiple layers of the reflection enhancing film can increase the reaction effect on light with same color, or it can increase the reaction effect on the light with different colors respectively. Specifically, it can be set according to actual needs.

In some embodiments of the present disclosure, the optical film layer 20 is a light absorbing film 22.

Use absorption effect of the light absorbing film to reduce the intensity of the emergent light with at least one color to adjust the color ratio, enhance the absorption effect of the light absorbing film and consider the adjustability, reducing a chromatic aberration between the flat display area 1 and the edge curved-surface display area 2.

In some embodiments of the present disclosure, the optical film layer is a light absorbing film; the larger an incident angle of a light incident on the light absorbing film, the lower a transmittance of a light that passes through the light absorbing film.

According to Beer-Lambert's law, a relationship between a transmittance of the light absorbing film and an incident angle of a light incident on the light absorbing film is $$T = 10 \frac{Kd}{\cos\theta}.$$

It can be seen that when K is constant, the incident angle increases, and the light transmittance decreases, where T is a transmittance of the light absorbing film, d is a thickness of the light absorbing film, $\ominus$ is an angle at which light enters the light absorbing film, K is a product of k and c, k is a molar absorption coefficient, and c is a molar concentration of a light absorbing substance. The transmittance of the light absorbing film can also be adjusted by selecting materials with different K values.

In embodiments of the present disclosure, the light absorbing film may use an organic compound that can absorb light with at least one color of red, green, and blue. When an incident light is incident on the light absorbing film, a physical distance traveling in the light absorbing film increases, the absorption effect of the light absorbing film is enhanced. Similarly, the light absorbing film structure can also adopt the concave-convex structure in FIG. 4 and FIG. 5, and the absorption effect is enhanced as the inclination angle of the light absorbing film increases.

The optical film layer 20 is provided with a first surface and a second surface opposite to each other; the first surface is located on a side of the optical film layer 20 close to the encapsulation layer 30, and at least one of the first surface and the second surface is a concave-convex surface.

In embodiments of the present disclosure, the optical film layer 20 is a light absorbing film. In some embodiments of the present disclosure, the first surface and the second surface are both concave-convex surfaces. The physical distance that the incident light of the light absorbing film travels in the light absorbing film, thereby increasing the absorption effect of the light absorbing film.

In some embodiments of the present disclosure, a cross section of the first surface is a W shape, and a cross section of the second surface is a W shape. However, it is not limited to this, and it may be a plurality of U shapes.

In embodiments of the present disclosure, the surface of the light absorbing film close to the encapsulation layer 30 has a concave-convex structure, and the encapsulation layer 30 and the light absorbing film may be connected by an adhesive layer to increase the stability of the connection between the encapsulation layer 30 and the light absorbing film.

In embodiments of the present disclosure, the manufacturing process of the reflection enhancing film is as follows:

A SiNx layer is plated on the encapsulation layer corresponding to the edge curved-surface display area 2 by chemical vapor deposition;

A concave-convex structure is formed on the SiNx layer 70 through exposure and development;

Then, a reflection enhancing film is formed on the SiNx layer 70 through a sputtering process (so that the reflection enhancing film is concave-convex), specifically:

Use liquid glue to fill up a side of the reflection enhancing film away from the encapsulation layer to facilitate assembly with the touch cover.

Whether a concave-convex surface of the light absorbing film is filled or not can be set according to actual needs. In other embodiments, the concave-convex surface of the light absorbing film may not be filled, that is, after assembly with the cover, there is a gap between a concave portion of the light absorbing film and the cover.

The light absorbing film can be a single layer or multiple layers. When the light absorbing film is a multi-layer, multiple layers of the light absorbing film can increase the reaction effect on light with same color, or it can increase the reaction effect on the light with different colors respectively. Specifically, it can be set according to actual needs.

The following table is a simulated value of the light absorption rate of the light absorbing film for at least one color of light under specific conditions. If a light absorbing film with an absorption rate of 10% is used, a thickness of the light absorbing film is 10 nm and a wavelength of incident green light is 525 nm. Through simple simulation, the relationship between an attenuation ratio and an incident angle φ of the light incident on the light absorbing film is obtained. The specific data is shown in the table below. The larger the incident angle φ, the higher the attenuation ratio (the greater the light absorption rate). But to ensure the optical effect, the incident angle φ should not be too large. The structure in which at least one of the first surface and the second surface is a concave-convex surface can increase the light absorption effect on the one hand, and can appropriately reduce the thickness of the light absorbing film on the other hand.

| angel φ | light absorption rate |
|---|---|
| 0 | 10% |
| 2 | 10.23% |
| 4 | 10.64% |
| 6 | 11.52% |
| 8 | 12.7% |
| 10 | 13.97% |
| 12 | 16.43% |

An OLED display device is further provided according to some embodiments of the present disclosure, including the above OLED display panel 100

The display device includes, but is not limited to: a radio frequency unit, network module, audio output unit, input unit, sensor, display unit, user input unit, interface unit, memory, processor, power supply and the like. Those skilled in the art may understand that the above-mentioned display device structure does not constitute a limitation on the display device, and the display device may include more or less of the above-mentioned components, or combine certain components, or have different component arrangement. In the embodiments of the present disclosure, the display device includes, but is not limited to: a display, a mobile phone, a tablet computer, a television, a wearable electronic device, a navigation display device, and the like.

In some embodiments of the present disclosure, the OLED display device further includes a touch cover 10 on the optical film layer 20, and the touch cover includes a cover, a touch sensor and a polarizer formed on the cover.

The optical film layer 20 is provided between the touch cover 10 and the encapsulation layer 30 of the OLED display panel 100. Use the reflection enhancing function of the reflection enhancing film and the absorption function of the light absorbing film to reduce the intensity of one or several kinds of light in the emergent light (such as RGB, But the present disclosure is not limited to this), and then adjust the RGB ratio of the emergent light of the edge curved-surface display area 2, reducing the chromatic aberration between the flat display area 1 and the edge curved-surface display area 2.

It should be noted that the embodiments in this specification are described in a progressive manner, and the same or similar parts between the embodiments can be referred to each other. It should be noted that the embodiments in this specification are described in a progressive manner, and the same or similar parts between the embodiments can be referred to each other.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection" or "connected" are not limited to physical or mechanical connections, but may include electrical connections, whether direct or indirect. Terms "Up", "down", "left", "right", etc. are only used to indicate the relative position relationship.

It will be understood that when an element, such as a layer, film, area or substrate, is referred to as being "on" or "under" another element, it can be directly on or directly under the other element, or intervening elements may also be present.

The specific features, structures, materials or characteristics in the description of forgoing implementations may be combined in any one or more embodiments or examples in proper manners.

The above descriptions merely describe optional implementations of the present disclosure. It is appreciated, modifications and improvements may be made by a person of ordinary skill in the art without departing from the principle of the present disclosure, and these modifications and improvements shall fall within the scope of the present disclosure.

What is claimed is:

1. An OLED display panel, comprising:
a flat display area and an edge curved-surface display area; wherein the edge curved-surface display area is provided with an optical film layer, and the optical film layer is configured to reduce a light intensity of emergent light with a preset color in the edge curved-surface display area;
a light-emitting unit; and
an encapsulation layer,
wherein the encapsulation layer is disposed on a side of the light-emitting unit close to a light-emitting surface of the OLED display panel and the optical film layer is disposed on a side of the encapsulation layer away from the light-emitting unit, and
wherein the optical film layer comprises a reflection enhancing film; subsequent to an entrance of an incident light into the reflection enhancing film, a propagation distance d of the incident light in the reflection enhancing film satisfies a following formula: $2nd=(2k+1)\lambda/2$, to increase a reflectivity of light with a wavelength of $\lambda$, where $k=0, 1, 2 \ldots$, n is a refractive index of the reflection enhancing film.

2. The OLED display panel according to claim 1, wherein the light-emitting unit comprises an anode, a light-emitting layer and a cathode; wherein the anode, the light-emitting layer, the cathode and the encapsulation layer are set in sequence, and the optical film layer is disposed on a side of the encapsulation layer away from the cathode.

3. The OLED display panel according to claim 1, wherein subsequent to the entrance of the incident light into the reflection enhancing film, a propagation distance d of the incident light in the enhancing film satisfies a following formula: $d=\lambda/4n$.

4. The OLED display panel according to claim 1, wherein a thickness of the reflection enhancing film decreases with an increase of an incident angle of light incident to the reflection enhancing film.

5. The OLED display panel according to claim 1, wherein the optical film layer comprises a light absorbing film; wherein a transmittance of light that passes through the light absorbing film becomes lower as an incident angle of light incident to the light absorbing film becomes larger.

6. The OLED display panel according to claim 1, wherein the optical film layer is provided with a first surface and a second surface opposite to each other; wherein the first surface is located on a side of the optical film layer close to the encapsulation layer, and at least one of the first surface and the second surface is a concave-convex surface.

7. The OLED display panel according to claim 6, wherein a cross section of the first surface is a W shape, and a cross section of the second surface is a W shape.

8. The OLED display panel according to claim 1, wherein the preset color comprises at least one color.

9. An OLED display device comprising the OLED display panel according to claim 1.

10. The OLED display device according to claim 9, further comprising: a touch panel located on the optical film layer.

* * * * *